(12) United States Patent
Nojioka

(10) Patent No.: US 6,383,603 B1
(45) Date of Patent: May 7, 2002

(54) PRINTED WIRING BOARD AND MANUFACTURING METHOD THEREOF

(75) Inventor: Shinichi Nojioka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/390,637

(22) Filed: Sep. 7, 1999

(30) Foreign Application Priority Data

Sep. 21, 1998 (JP) .......................................... 10-266252

(51) Int. Cl.$^7$ ................................................. B32B 3/10
(52) U.S. Cl. ........................ 428/132; 428/195; 428/901; 174/261; 174/262; 257/774; 361/768
(58) Field of Search ................................. 174/262, 263, 174/264, 265, 266, 261; 361/767, 768, 771, 774; 257/774; 29/840; 16/60; 428/132, 195, 901

(56) References Cited

U.S. PATENT DOCUMENTS

| 5,707,714 A | 1/1998 | Furutatsu et al. ............ 428/209 |
| 6,091,155 A * | 7/2000 | Jonaidi ........................ 257/786 |

FOREIGN PATENT DOCUMENTS

| JP | 243798 | 2/1990 |
| JP | 355899 | 3/1991 |
| JP | 7254774 | 10/1995 |

OTHER PUBLICATIONS

Patent Abstracts of Japan, vol. 1997, No. 06, Jun. 30,1997, & JP 09 055580 A.
Patent Abstracts of Japan, vol. 1995, No. 08, Sep. 29, 1995, & JP 07 131139 A.
Patent Abstracts of Japan, vol. 1995, No. 08, Sep. 29, 1995, & JP 07 122843 A.
Patent Abstracts of Japan, vol. 1996, No. 02, Feb. 29, 1996, & JP 07 254774 A.
Patent Abstracts of Japan, vol. 018, No. 105, Feb. 21, 1994, & JP 05 304354 A.

* cited by examiner

Primary Examiner—Blaine Copenheaver
Assistant Examiner—Christopher Paulraj
(74) Attorney, Agent, or Firm—Birch, Stewart, Kolasch & Birch, LLP

(57) ABSTRACT

A printed wiring board with an increased strength of solder is provided by preventing solder bridge formation and increasing the amount of solder adherent thereto. A land (1) serving as a soldering foundation is formed in a star-shape, to minimize the proximal peripheral length (L2) between adjacent lands spaced distance (L1) apart, thus reducing the possibility of solder bridge formation. Since the star-shaped land (1) has a greater area than a rhombic land of identical size, the amount of solder adherent thereto is greater than that of the rhombic land, thus enabling to increase the strength of solder.

15 Claims, 5 Drawing Sheets

PRINTED WIRING BOARD AND MANUFACTURING METHOD THEREOF

BACKGROUND OF THE INVENTION

1. Field of the Invention

The present invention relates to a printed wiring board to which electronic parts are connected by soldering.

2. Description of the Background Art

FIG. 9 is a plan view of a conventional printed wiring board B5, looking from the printed wiring side. In the figure, the printed wiring board B5 comprises a substrate 4, an insertion opening 2 into which the lead of an electronic part is inserted, a land 6 serving as a soldering foundation, and a solder resist 3 that avoids soldering in other than the land 6. For the land 6, copper foil or the like is employed which is the printed wiring material. For the solder resist 3, an insulating synthetic resin is employed which has the property of preventing adhesion of solder.

The land 6 of FIG. 9 is in an oval-shape. The advantage of this resides in that a plurality of the lands 6 aligned in direction P provide greater land area than obtainable in employing a circular land of a diameter equal to the short diameter of the land 6 (the maximum diameter in direction P), thereby increasing the amount of solder adherent thereto.

Unfortunately, solder bridge, which is the phenomenon that solder bridges two or more lands, is liable to occur because length L2 of the proximal peripheries of the adjacent lands 6 separated distance L1 apart is long as shown in FIG. 9.

FIG. 10 shows a printed wiring board B6 having a rhombic land 7 which incorporates an improvement in preventing solder bridge. The printed wiring board B6 has the same construction as the printed wiring board B5, except that the land 6 is replaced with the rhombic land 7 in which the length of diagonals correspond to the long diameter (the maximum diameter in a direction orthogonal to direction P) and the small diameter of the land 6, respectively. The diagonal having the length of the small diameter of the land 6 is aligned in direction P. Thereby, as shown in FIG. 10, length L2 of the proximal peripheries of the adjacent lands 7 can be reduced considerably, so that the possibility of forming solder bridge is quite remote.

The rhombic land 7 is, however, unsuitable in terms of soldering, because the area of the rhombic land 7 is smaller than that of the oval-shaped land 6. Specifically, when soldering is performed by, for example, immersing the printed wiring board B6 into a solder bath storing a molten solder, the amount of solder adherent thereto is insufficient because the area of the land 7 is small. Less amount of solder may reduce the strength of solder in the event that products mounting the printed wiring board B6 are subjected to impact such as vibration in shipping, and impact due to heat cycle such as temperature change in the environment in use, or temperature change at the turning on/off a power supply.

To avoid the above problem, it is necessary to search for part having less amount of solder adherent thereto and then add solder to the corresponding part. This increases the processing time needed in manufacturing products mounting the printed wiring board B6. In addition, there is the possibility of the secondary fault such as skipping of search in the process to add solder, and solder bridge formation due to drips of the added solder, thus failing to ensure a high degree of reliability of soldering.

As the shape to minimize length L of the proximal peripheries of the adjacent lands spaced distance L1 apart, a convex polygon including vertexes other than the respective vertexes of a rhombus is considered. Such a convex polygon can increase the amount of solder adherent thereto because its area is greater than that of a rhombus. However, its shape approaches the oval-shape shown in FIG. 9, and thus the possibility of solder bridge formation is higher than that of the rhombic land. The possibility of solder bridge formation is high particularly when soldering is made by bringing a plurality of lands into contact with a molten solder at one time.

SUMMARY OF THE INVENTION

According to a first aspect of the present invention, a printed wiring board comprises: a substrate having a surface; an insertion opening being provided in the substrate and opening into the surface such that a part's lead passes through the substrate; and a conductive land surrounding the insertion opening on the surface and having a periphery of a shape which is obtained by providing a projection on at least one side of a rhombus.

According to a second aspect, the printed wiring board of the first aspect is characterized in that the projection is provided on each side of the rhombus.

According to a third aspect, the printed wiring board of the first aspect is characterized in that the projection is in the shape of a right triangle, a hypotenuse of which is in contact with the one side of the rhombus, the hypotenuse being shorter than the one side of the rhombus.

According to a fourth aspect, the printed wiring board of the first aspect is characterized in that the projection has a tip and the tip is located within an area of a right triangle defined outside of the rhombus, a hypotenuse of the right triangle corresponding to the one side of the rhombus and two sides other than the hypotenuse being parallel to either of diagonals of the rhombus.

According to a fifth aspect, the printed wiring board of the first aspect is characterized in that the projection has a tip; a plurality of the lands are provided; and a bisector of an angle of the tip of the projection in one the land and another bisector of an angle of said tip of said projection in the other the land adjacent one the land are not disposed coaxially.

According to a sixth aspect, a printed wiring board comprises: a substrate having a surface; an insertion opening being provided in the substrate and opening into the surface such that a part's lead passes through the substrate; a conductive land surrounding the insertion opening on the surface; and at least either a solder resist or a material for indication, having a periphery of a shape which is obtained by providing a projection on at least one side of a rhombus, and covering the land such as to expose the land.

According to a seventh aspect, a method of manufacturing a printed wiring board comprises the steps of: a first step of preparing a substrate having a conductive land formed on a surface and an insertion opening that opens into the land to allow a part's lead to pass therethrough; and a second step of forming at least either a solder resist or a material for indication on a surface of the land, and exposing the surface of the land such as to have a periphery of a shape which is obtained by providing a projection on at least one side of a rhombus.

The use of the printed wiring board according to the first aspect enables to minimize the length of the proximal peripheries of the adjacent lands, thus reducing the possibility of solder bridge formation. In addition, the area of the land is greater than that of a rhombic land, permitting to adhere more solder than the case of soldering to the rhombic land. This increases the strength of solder and leads to a high degree of reliability.

The use of the printed wiring board according to the second aspect avoids solder bridge formation to be caused by providing a plurality of projections.

The use of the printed wiring board according to the third aspect ensures that more solder is adhered than the case of soldering to a rhombic land, while the possibility of solder bridge formation is reduced because the projection has a perpendicular tip.

The use of the printed wiring board according to the fourth aspect does not increase the possibility of solder bridge formation than the case of employing a rhombic land because, when a plurality of lands are disposed such that the diagonals of the rhombus lie on the same axis, there is no possibility that the distance between the tip of the projection and an arbitrary part of the land adjacent thereto is smaller than the distance between the proximal peripheries of the adjacent lands.

The use of the printed wiring board according to the fifth aspect enables to further reduce the possibility of solder bridge formation because the tip of a projection and the tip of the adjacent land extend in different directions.

The use of the printed wiring board according to the sixth aspect enables to minimize the length of the proximal peripheries of the adjacent lands, thus reducing the possibility of solder bridge formation. Since the area of the land is greater than that of a rhombic land, it is possible to adhere more solder than the case of soldering the rhombic land, thereby increasing the strength of solder and leads to a high degree of reliability. Also, a large adhesion area of the land to the substrate lessens the possibility that the land comes off the substrate. In addition, it is possible to further reduce the possibility of solder bridge formation by a tall barrier between the adjacent lands when the solder resist and the material for indication are accumulated on the surface of the land.

With the method of manufacturing a printed wiring board according to the seventh aspect, the step of forming a solder resist or a material for indication can serve for the process of exposing the land such as to have the shape in which a projection is provided on each side of a rhombus. This lowers the possibility of solder bridge formation and facilitates to obtain a printed wiring board with high strength of solder.

It is therefore an object of the present invention to provide a printed wiring board with a high degree of reliability which is attained by preventing solder bridge formation between adjacent lands when a molten solder is allowed to adhere to the lands and the leads of electronic parts, and by increasing the strength of solder with an increased amount of solder adherent thereto.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
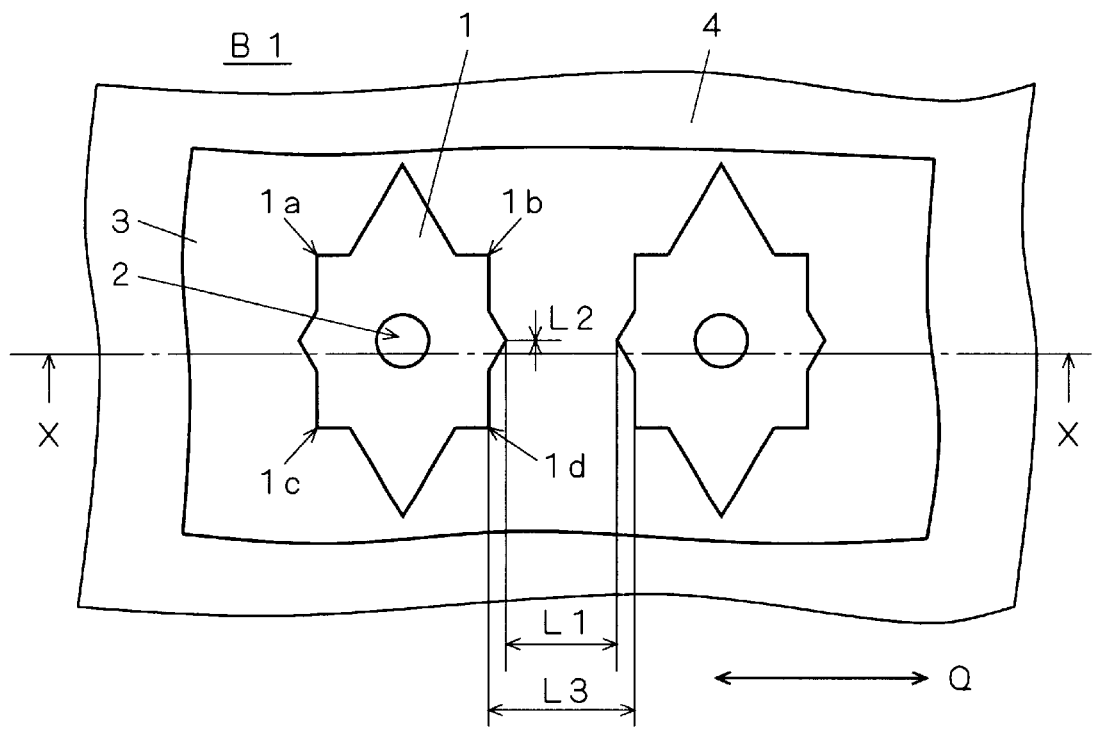
FIG. 1 is a plan view illustrating the structure of a first preferred embodiment according to the present invention.
Figure 2:
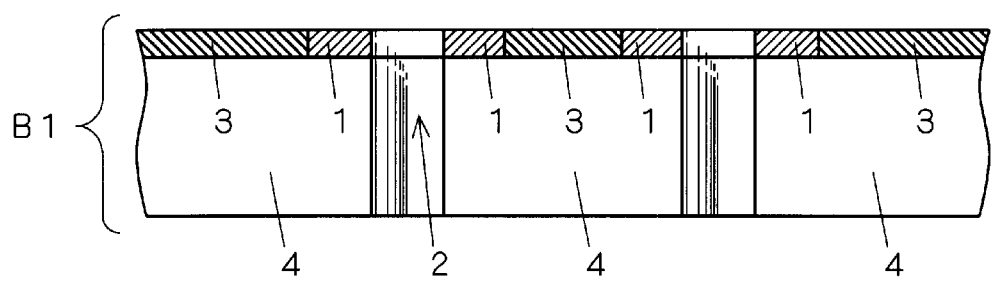
FIG. 2 is a cross section illustrating the structure of the first preferred embodiment.
Figure 10:
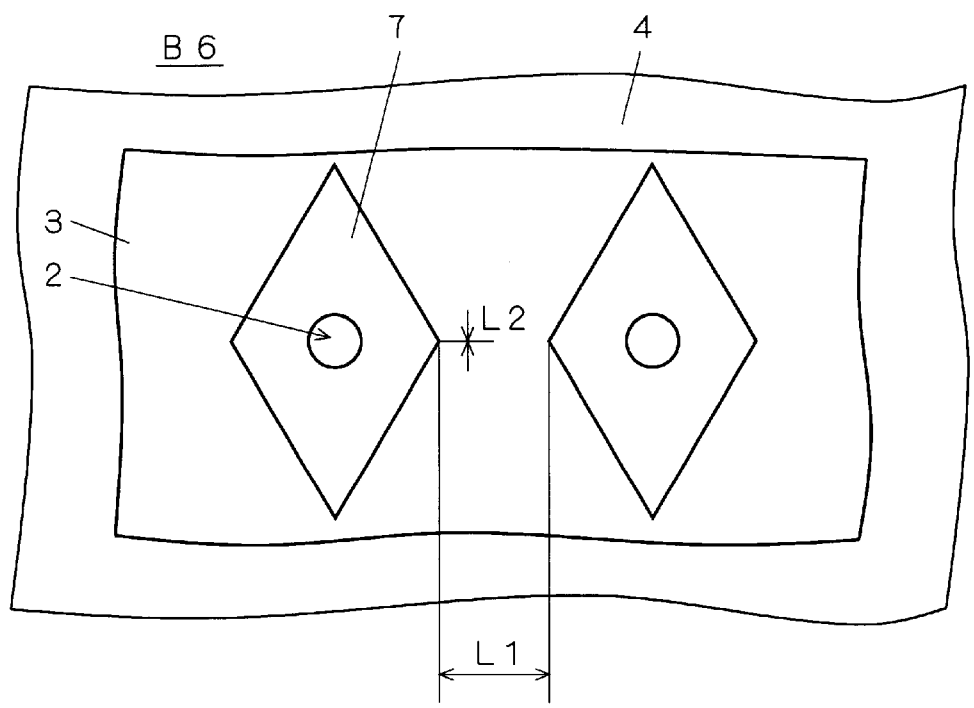
FIG. 10 is a plan view illustrating another structure of prior art.

FIG. 1 is a plan view of a printed wiring board B1, looking from the printed wiring side, according to a first preferred embodiment of the invention. FIG. 2 is a cross section taken along the line X—X of the printed wiring board B1 of FIG. 1. Referring to FIG. 1, the printed wiring board B1 comprises a substrate 4, an insertion opening 2 passing through the substrate 4, a land 1 surrounding the insertion opening 2 on the surface of the substrate 4, and a solder resist 3 covering the surface of the substrate 4, as in the conventional printed wiring boards B5 and B6. Here, the land 1 is in the shape which is obtained by adding projections 1*a* to 1*d* to their respective sides of a rhombus (hereinafter this shape is referred to as "star-shape"). Specifically, the star-shaped land 1 is obtained by overlapping a rhombus employed as the shape of the land 7 in FIG. 10, and a rectangle which has sides parallel to either of the diagonals of the rhombus and shorter than the either of the diagonals. The rectangle has the sides parallel to direction Q in which the lands 1 are aligned.

The use of the printed wiring board B1 enables to minimize length L2 of the proximal peripheries of the adjacent lands 1 spaced distance L1 apart, thereby reducing the possibility of solder bridge formation. In addition, the star-shaped land 1 of FIG. 1 has a greater area than that of the rhombic land 7 of FIG. 10 by the amount of the projections 1*a* to 1*d*. This enables to adhere more solder than the case of soldering the rhombic land 7, so that the strength of solder is increased and a high degree of reliability is obtained.

Referring to FIG. 1, in the star-shaped land 1 the peripheral length L2 is minimized, however, there is a possibility that solder bridge might be formed between part of the sides of the rectangles which are in parallel relationship and spaced distance L3 apart.

The possibility is, however, dispelled by having distance L3 of not less than 0.7 mm. This is based on data taken by experiments that the possibility of solder bridge formation is reduced considerably when the distance between the peripheries of the adjacent lands is not less than 0.7 mm.

The star-shape, each side of which has a single projection, is described with reference to FIG. 1. The number of projections per side is preferably one because the land shape provided with too many projections approaches an oval-shape, thereby increasing the possibility of solder bridge formation. In the present invention, however, the star-shape is not limited to the above-mentioned one, and a plurality of projections may exist on each side.

Also, the star-shape obtained in a combination of a rectangle and a rhombus is described with reference to FIG. 1. A rhombus in which the tip of a projection has an excessive obtuse angle will resemble or coincide with a convex polygon, thereby increasing the possibility of solder bridge formation. On the other hand, a rhombic land in which the tip of a projection has an excessive acute angle will decrease the land area, resulting in less amount of solder adherent thereto. Additionally, the formation of lands having too fine projections involves difficulties in printing technique. Therefore the tip of a projection is preferably perpendicular. That is, it is desirable that a projection is in the shape of a right triangle, its hypotenuses are in contact with the respective sides of a rhombus, and the length of the hypotenuse is smaller than the side of the rhombus. In the present invention, however, the star-shape is not limited to the above-mentioned one, and the tip of a projection may not be perpendicular.

Also, the star-shape in which each side of a rectangle is parallel to either of the diagonals of a rhombus and shorter than either of the diagonals of the rhombus, is described with reference to FIG. 1. This means that the tip of a star-shaped projection is located within the area of a right triangle defined outside of a rhombus, the hypotenuse of which corresponds to one side of the rhombus, two sides other than the hypotenuse being parallel to either of the diagonals of the rhombus. When a plurality of lands in the star-shape are disposed such that the diagonal of the rhombus lies on the same axis, there is no possibility that the distance from the tip of the projection (the vertex of the rectangle in FIG. 1) to an arbitrary part of the adjacent land is smaller than distance L1 between the proximal peripheries of the adjacent lands. Accordingly, the possibility of solder bridge formation cannot be greater than that of a rhombic land.

Further, it is desirable that the bisector of the point angle of a projection in a land and that in the adjacent land are not coaxially disposed. This is based on the aim of avoiding solder bridge formation more reliably by such an arrangement that the tip of a projection and the tip of the adjacent land extend in different directions. If they extend in the same direction, the possibility of solder bridge formation is increased.

Second Preferred Embodiment

Figure 3:
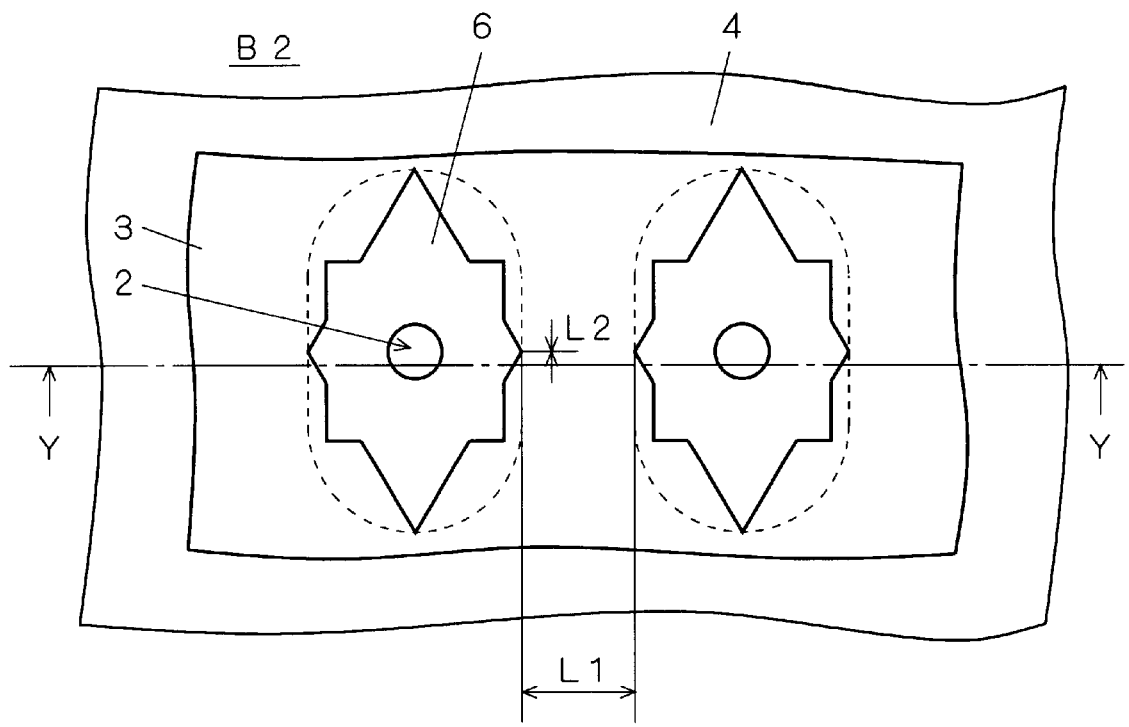
FIG. 3 is a plan view illustrating the structure of a second preferred embodiment.
Figure 4:
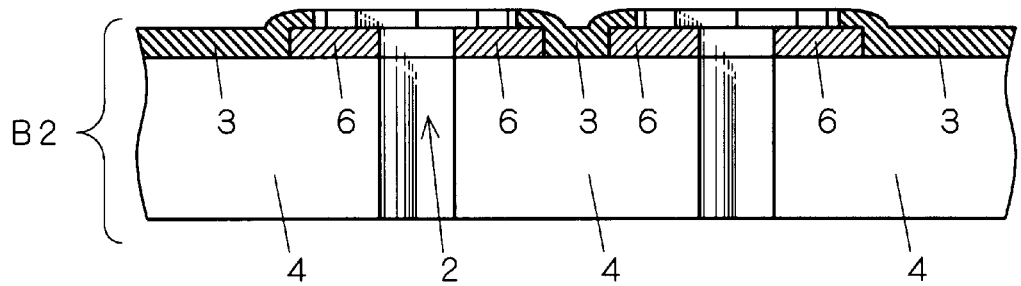
FIG. 4 is a cross section illustrating the structure of the second preferred embodiment.

FIG. 3 is a plan view of a printed wiring board B2, looking from the printed wiring side, according to a second preferred embodiment. FIG. 4 is a cross section taken along the line Y—Y of the printed wiring board B2 in FIG. 3. Referring to FIGS. 3 and 4, the printed wiring board B2 comprises, as in the conventional printed wiring board B5, a substrate 4, an insertion opening 2 passing through the substrate 4, an oval-shaped land 6 surrounding the insertion opening 2 on the surface of the substrate 4, and a solder resist 3 covering the surface of the substrate 4, except for the area of the land 6. Here, the solder resist 3 is formed to the upper surface of the land 6 such that the shape of the land 6 as viewed from the printed wiring side is in the star-shape as described in the first preferred embodiment.

The use of the printed wiring board B2 of the second preferred embodiment enables to obtain, in addition to the effect of the printed wiring board B1, the effect that the land 6 is less liable to come off the substrate 4 because the area of the oval-shaped land 6 adherent to the substrate 4 is greater than that obtained by the star-shaped land 1 of the printed wiring board B1.

Third Preferred Embodiment

Figure 5:
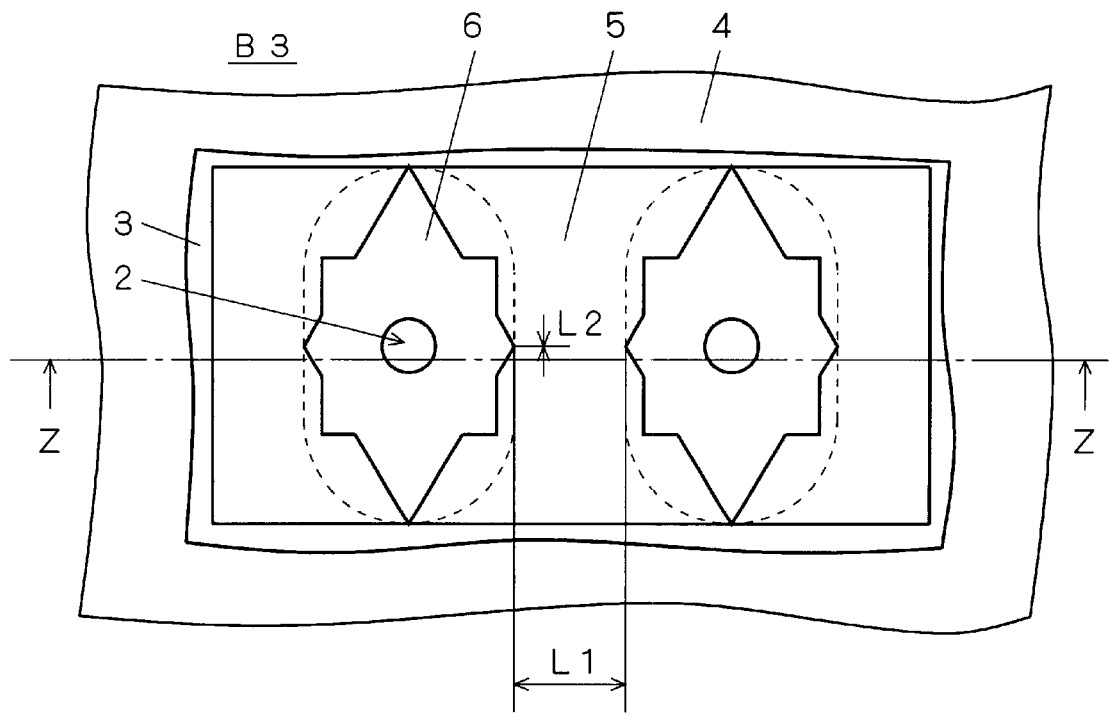
FIG. 5 is a plan view illustrating the structure of a third preferred embodiment.
Figure 6:
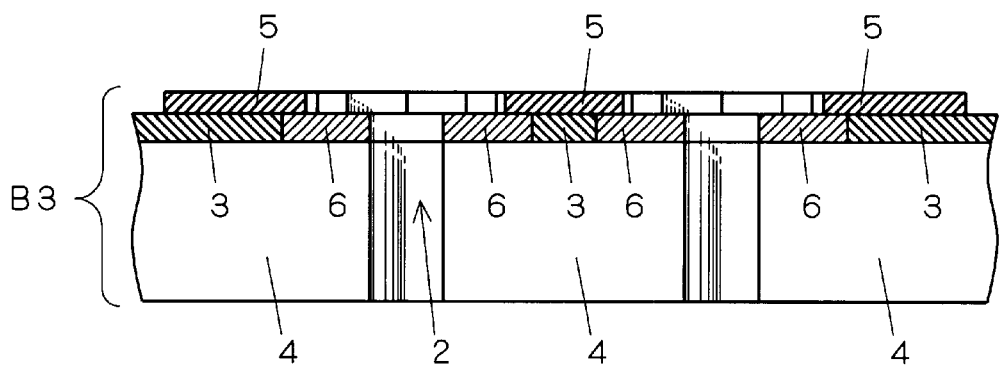
FIG. 6 is a cross section illustrating the structure of the third preferred embodiment.

FIG. 5 is a plan view of a printed wiring board B3, looking from the printed wiring side, according to a third preferred embodiment. FIG. 6 is a cross section taken along the line Z—Z of the printed wiring board B3 in FIG. 5. Referring to FIGS. 5 and 6, the printed wiring board B3 comprises, as in the conventional printed wiring board B5, a substrate 4, an insertion opening 2 passing through the substrate 4, an oval-shaped land 6 surrounding the insertion opening 2 on the surface of the substrate 4, and a solder resist 3 covering the surface of the substrate 4, except for the area of the land 6. In addition to these, the printed wiring board B3 has a material for indication 5 which is used for indicating characters or figures on the surface of the printed wiring board B3. The material for indication 5 covers the land 6 such that the shape of the land 6 as viewed from the printed wiring board side is in the star-shape as described in the first preferred embodiment. That is, the material for indication 5 substitutes for the solder resist 3 on the land 6 of the printed wiring board B2 according to the second preferred embodiment.

The use of the printed wiring board B3 of the third preferred embodiment produces the same effect as the printed wiring board B2 of the second preferred embodiment.

Fourth Preferred Embodiment

Figure 7:
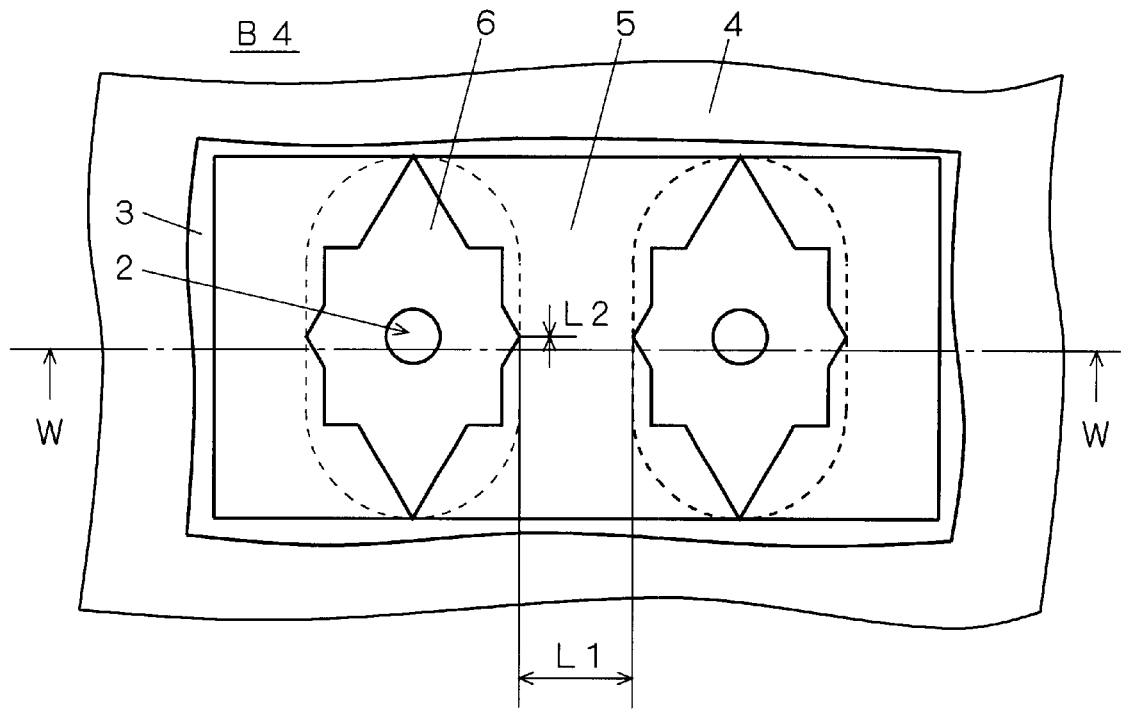
FIG. 7 is a plan view illustrating the structure of a fourth preferred embodiment.
Figure 8:
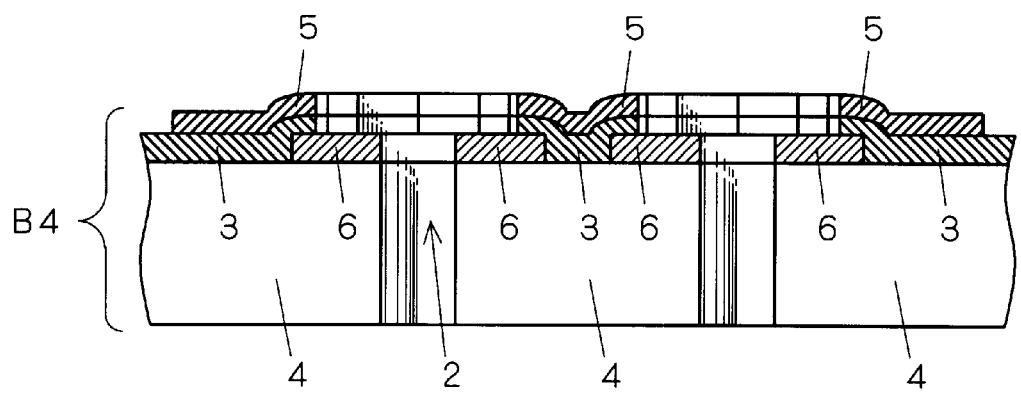
FIG. 8 is a cross section illustrating the structure of the fourth preferred embodiment.
Figure 9:
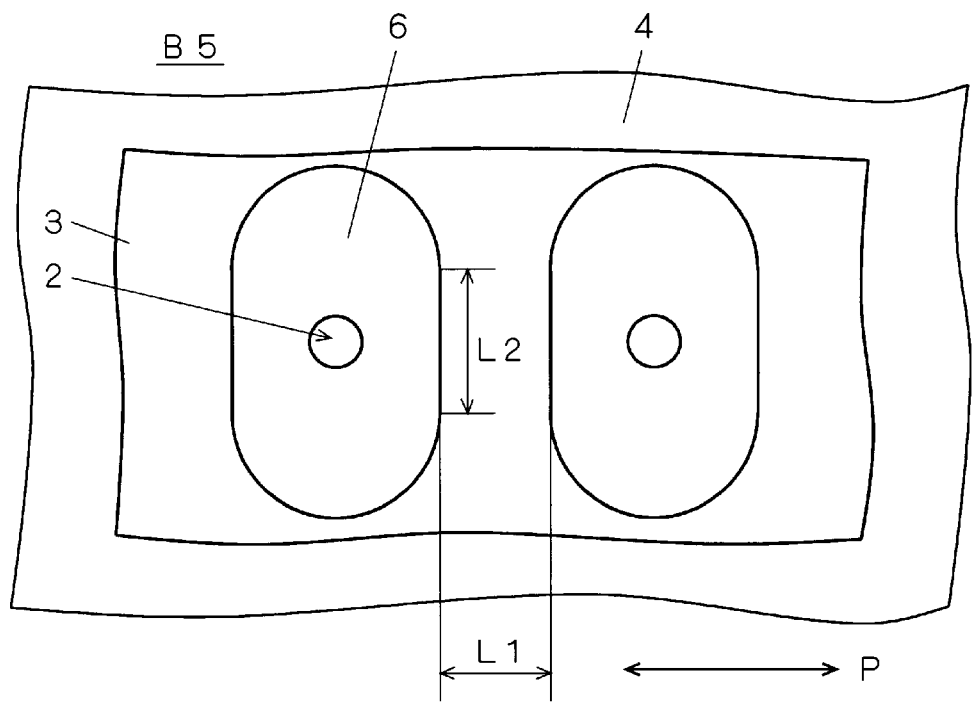
FIG. 9 is a plan view illustrating a structure of prior art.

FIG. 7 is a plan view of a printed wiring board B4, looking from the printed wiring side, according to a fourth preferred embodiment. FIG. 8 is a cross section taken along the line W—W of the printed wiring board B4 in FIG. 7. Although the printed wiring board B4 looks the same as the printed wiring board B3 of the third preferred embodiment, they are of different structures, as can be seen from FIG. 8. Referring to FIGS. 7 and 8, the printed wiring board B4 comprises, as in the printed wiring board B2 of the second preferred embodiment, a substrate 4, an insertion opening 2 passing through the substrate 4, an oval-shaped land 6 surrounding the insertion opening 2 on the surface of the substrate 4, and a solder resist 3 covering the surface of the substrate 4 and the land 6, except for the star-shaped area of the land 6. In addition to these, the printed wiring board B4 has a material for indication 5 disposed on the upper surface of the solder resist 3. Like the solder resist 3, the material for indication 5 covers the land 6 such as to expose it in a star-shape.

The use of the printed wiring board B4 of the fourth preferred embodiment enables to obtain, in addition to the effect of the printed wiring board B2 of the second preferred embodiment, the effect that solder bridge formation between adjacent lands is prevented more reliably because a tall barrier between adjacent lands is formed by the solder resist 3 and the material for indication 5 which are accumulated on the surface of the land 6.

Fifth Preferred Embodiment

According to a fifth preferred embodiment, a method of manufacturing a printed wiring board B2 of the second preferred embodiment is provided.

Firstly, an oval-shaped land 6 similar to that of the conventional printed board B5 is formed on a substrate 4. A solder resist 3 is then formed on part of the substrate 4 in which the land 6 is not present. At this time, the solder resist 3 is also formed on the surface of the land 6 by using a pattern for exposing the land 6 in a star-shape. The solder resist 3 is usually formed by means of printing of a liquid solder resist with a printing mask, or a photosensitive film. The solder resist printing mask or photosensitive film is in advance subjected to drawing of a pattern for exposing the land 6 in the star-shape.

With the method of manufacturing a printed wiring board in the fifth preferred embodiment, the printed wiring board B2 of the second preferred embodiment can be obtained, without increasing the number of manufacturing steps, if only drawn the pattern for exposing the land 6 in the star-shape, on a solder resist printing mask or photosensitive film used in the step of forming a solder resist 3.

Sixth Preferred Embodiment

According to a sixth preferred embodiment, a method of manufacturing a printed wiring board B3 of the third preferred embodiment is provided.

Firstly, an oval-shaped land 6 similar to that of the conventional printed board B5 is formed on a substrate 4. A solder resist 3 is then formed on part of the substrate 4 in which the land 6 is not present. Further, a material for indication 5 is formed which is used for indicating characters or figures on the surface of the printed wiring board B3. At this time, the material for indication 5 is also formed on the surface of the land 6 by using a pattern for exposing the land 6 in a star-shape. The material for indication 5 is usually formed by application with silk screen printing. The silk screen is in advance subjected to drawing of a pattern for exposing the land 6 in the star-shape.

With the method of manufacturing a printed wiring board in the sixth preferred embodiment, the printed wiring board B3 of the third preferred embodiment can be obtained, without increasing the number of manufacturing steps, if only drawn the pattern for exposing the land 6 in the star-shape, on a silk screen used in the step of forming a material for indication 5.

Seventh Preferred Embodiment

According to a seventh preferred embodiment, a method of manufacturing a printed wiring board B4 of the fourth preferred embodiment is provided.

In this method, the step of forming a material for indication 5 is added to the steps in the method of the fifth preferred embodiment. In this step, a material for indication 5 is formed on the surface of a solder resist 3 surrounding a land 6 by using a pattern for exposing a land 6 in the same star-shape as the fifth preferred embodiment, thereby obtaining a printed wiring board B4 of the fourth preferred embodiment. The pattern for exposing the land 6 in the star-shape may be drawn in advance on a silk screen used in printing the material for indication 5.

With the method of manufacturing a printed wiring board in the seventh preferred embodiment, the printed wiring board B4 of the fourth preferred embodiment can be obtained, without increasing the number of manufacturing steps, only if drawn the pattern for exposing the land 6 in the star-shape, on a solder resist printing mask or photosensitive film used in the step of forming a solder resist 3, and on a silk screen used in the step of forming a material for indication 5.

While the invention has been shown and described in detail, the foregoing description is in all aspects illustrative and not restrictive. It is therefore understood that numerous modifications and variations can be devised without departing from the scope of the invention.

What is claimed is:

1. A printed wiring board comprising:
    a substrate having a surface;
    an insertion opening being provided in said substrate and opening into said surface such that a part's lead passes through said substrate; and
    a conductive land surrounding said insertion opening on said surface and having a periphery of a shape which is obtained by providing a projection on at least one side of a rhombus wherein said insertion opening is present within the periphery of the rhombus shape.

2. A printed wiring board according to claim 1 wherein said projection is provided on each side of said rhombus.

3. A printed wiring board according to claim 1 wherein said projection is in the shape of a right triangle, a hypotenuse of which is in contact with said one side of said rhombus, said hypotenuse being shorter than said one side of said rhombus.

4. A printed wiring board according to claim 1 wherein said projection has a tip, said tip being located within an area of a right triangle defined outside of said rhombus, a hypotenuse of said right triangle corresponding to said one side of said rhombus and two sides other than said hypotenuse being parallel to either of diagonals of said rhombus.

5. A printed wiring board according to claim 1 wherein,
    said projection has a tip;
    a plurality of said lands are provided; and
    a bisector of an angle of said tip of said projection in one said land and another bisector of an angle of said tip of said projection in the other said land adjacent one said land are not disposed coaxially.

6. A printed wiring board comprising:
    a substrate having a surface;
    an insertion opening being provided in said substrate and opening into said surface such that a part's lead passes through said substrate;
    a conductive land surrounding said insertion opening on said surface; and
    at least either a solder resist or a material for indication, having a periphery of a shape which is obtained by providing a projection on at least one side of a rhombus, and covering said land such as to expose said land wherein said insertion is present within the periphery of the rhombus shape.

7. A printed wiring board according to claim 6 wherein said projection is provided on each side of said rhombus.

8. A printed wiring board according to claim 6 wherein said projection is in the shape of a right triangle, a hypotenuse of which is in contact with said one side of said rhombus, said hypotenuse being shorter than said one side of said rhombus.

9. A printed wiring board according to claim 6 wherein said projection has a tip, said tip being located within an area of a right triangle defined outside of said rhombus, a hypotenuse of said right triangle corresponding to said one side of said rhombus and two sides other than said hypotenuse being parallel to either of diagonals of said rhombus.

10. A printed wiring board according to claim 6 wherein,
    said projection has a tip;
    a plurality of said lands are provided; and
    a bisector of an angle of said tip of said projection in one said land and another bisector of an angle of said tip of said projection in the other said land adjacent one said land are not disposed coaxially.

11. A method of manufacturing a printed wiring board comprising the steps of:
    a first step of preparing a substrate having a conductive land formed on a surface and an insertion opening into said land to allow a part's lead to pass therethrough; and
    a second step of forming at least either a solder resist or a material for indication on a surface of said land, and exposing said surface of said land such as to have a periphery of a shape which is obtained by providing a projection on at least one side of a rhombus wherein said opening is present within the periphery of the rhombus shape.

12. A method of manufacturing a printed wiring board according to claim 11, wherein said projection is provided on each side of said rhombus.

13. A method of manufacturing a printed wiring board according to claim 11, wherein said projection is in the shape of a right triangle, a hypotenuse of which is in contact with said one side of said rhombus, said hypotenuse being shorter than said one side of said rhombus.

14. A method of manufacturing a printed wiring board according to claim 11, wherein said projection has a tip, said tip being located within an area of a right triangle defined outside of said rhombus, a hypotenuse of said right triangle corresponding to said one side of said rhombus and two sides other than said hypotenuse being parallel to either of diagonals of said rhombus.

15. A method of manufacturing a printed wiring board according to claim 11, wherein said projection has a tip, a plurality of said lands are provided, and a bisector of an angle of said tip of said projection in one said land and another bisector of an angle of said tip of said projection in the other said land adjacent one said land are not disposed coaxially.

* * * * *